United States Patent
He

(10) Patent No.: US 7,109,555 B1
(45) Date of Patent: Sep. 19, 2006

(54) METHOD FOR PROVIDING SHORT CHANNEL EFFECT CONTROL USING A SILICIDE VSS LINE

(75) Inventor: Yue-Song He, San Jose, CA (US)

(73) Assignee: Spansion LLC, Sunnyvale, CA (US)

( * ) Notice: Subject to any disclaimer, the term of this patent is extended or adjusted under 35 U.S.C. 154(b) by 0 days.

(21) Appl. No.: 10/835,341

(22) Filed: Apr. 28, 2004

(51) Int. Cl.
| | |
|---|---|
| H01L 29/76 | (2006.01) |
| H01L 29/94 | (2006.01) |
| H01L 31/062 | (2006.01) |
| H01L 31/113 | (2006.01) |
| H01L 31/119 | (2006.01) |

(52) U.S. Cl. ..................... 257/382; 257/331
(58) Field of Classification Search ................ 257/382, 257/331, 315, 565, 575, 578; 438/289, 276, 438/257, 262
See application file for complete search history.

(56) References Cited

U.S. PATENT DOCUMENTS 6,171,939 B1 * 1/2001 Lin .............................. 257/382
6,268,247 B1 * 7/2001 Cremonesi et al. .. 257/E21.422

* cited by examiner

Primary Examiner—Walter L. Lindsay, Jr.

(57) ABSTRACT

A method for fabricating a semiconductor device having improved short channel effects is disclosed. The method includes operations such as, forming a hard mask layer on the surface of a semiconductor substrate, printing a photoresist mask above the hard mask layer, performing an etch of trenches in the semiconductor substrate and removing the hard mask layer and the photoresist mask. Moreover, the method includes forming a first polysilicon layer, etching the first polysilicon layer, forming a spacer layer and forming a second polysilicon layer. In addition, the method includes performing a stacked gate etch on the second polysilicon layer, performing an SAS etch, performing a shallow source implant and forming the spacer between the first polysilicon layer and the second polysilicon layer. A silicide line is subsequently formed to connect device source regions.

7 Claims, 10 Drawing Sheets

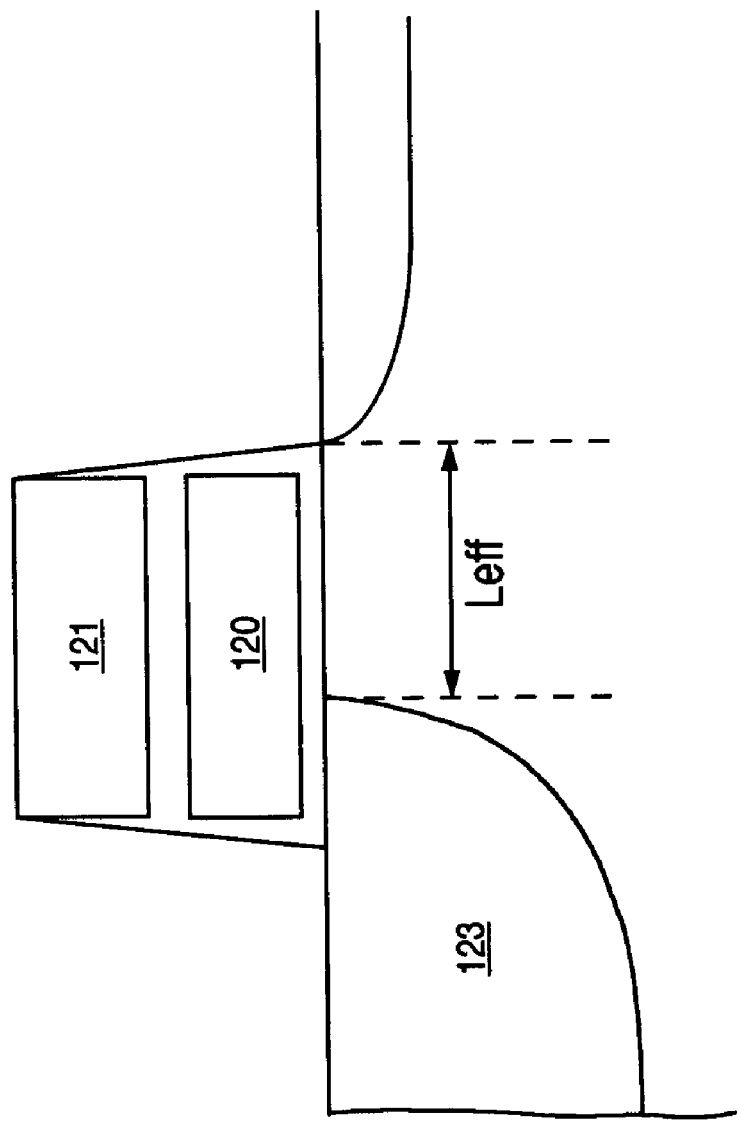

METHOD FOR PROVIDING SHORT CHANNEL EFFECT CONTROL USING A SILICIDE VSS LINE

FIELD OF THE INVENTION

Embodiments of the present invention relate generally to a semiconductor device fabrication process. In particular, an embodiment of the present invention relates to a semiconductor device fabrication process that provides short channel effect control.

BACKGROUND OF THE INVENTION

Many conventional semiconductor device fabrication processes produce semiconductor devices that exhibit short channel effects. Consequently, the development of processes that yield devices where the short channel effect is controlled in the devices that are produced is one of the biggest challenges confronting device manufacturers. The primary impact of the short channel effect is to cause an increase in the leakage or "off" current that is exhibited by a device when the device is in the off state. This leakage impacts the capacity of the device to perform ideally as a switch. A conventional process that illustrates this problem is shown in FIGS. 1A–1F.

FIG. 1A shows a diagram of a semiconductor wafer that is patterned using a conventional fabrication process. The diagram shows polycrystalline gate structures 101A–101D, source regions 103A and 103B, drain regions 105A and 105B, and shallow trench isolation (STI) regions 107A and 107B. An illustration that depicts a perspective view of the wafer as seen when cut along lines BB" (see FIG. 1A) is shown in FIG. 1B. An illustration that depicts a perspective view of the wafer as seen when cut along lines AA" (see FIG. 1B) is shown in FIG. 1F.

FIG. 1B shows a perspective view of a wafer as is seen when cut in the direction of line BB" shown in FIG. 1A. Referring to FIG. 1A, after the formation of a $Si_3N_4$ layer on a Si substrate, the $Si_3N_4$ layer is patterned using photoresist (e.g., PR). Subsequently, as shown in FIG. 1C, trenches are etched in the substrate and a layer of $SiO_2$ is formed in the trenches and over the remaining portions of the $Si_3N_4$ layer. Next, as shown in FIG. 1D, a CMP operation is performed in order to remove the $Si_3N_4$ layer.

A first layer of polysilicon 120 is then deposited on the surface of the remaining material (e.g., see FIG. 1D, TOX layer 122). Subsequently, as is shown in FIG. 1E, an etch of the first polysilicon layer 120 is performed and a layer of ONO 124 thereafter deposited. This is followed by the deposition of a second polysilcon layer 121. Finally, a stacked gate etch is performed resulting in the structure shown in FIG. 1F.

As is shown in FIG. 1F, a stacked gate structure may result from the process outlined in FIGS. 1A–1F. The illustration of FIG. 1F depicts a perspective view of the wafer as seen when cut along lines A" of FIG. 1A as was mentioned above. The first and second polysilicon layers (e.g., 120 and 121) are vertically aligned with the ONO layer in a stacked gate configuration. A VCI implant 123 is performed to connect all of the sources together. A very heavy VCI implant 123 is needed to form a low resistance line.

Problematic short channel effects result from the heavy VCI implantation 123 needed to form conductive lines that have low resistance. It should be appreciated that the effective channel length (e.g., $L_{eff}$) of the fabricated device is decreased as a result of the lateral diffusion of the source junction caused by such heavy VCI implantation 123. This lateral diffusion may significantly degrade the performance of the device.

SUMMARY OF THE INVENTION

Accordingly, a need exists for a method that provides short channel effect control by using a shallow source implant. The present invention provides a method that accomplishes this need.

For instance, one embodiment of the present invention includes a method for fabricating a semiconductor device having improved short channel effects. The method includes operations such as, forming a hard mask layer on the surface of a semiconductor substrate, printing a photoresist mask above the hard mask layer, performing an etch of trenches in the semiconductor substrate and removing the hard mask layer and the photoresist mask. Moreover, the method includes forming a first polysilicon layer, etching the first polysilicon layer, forming a spacer layer and forming a second polysilicon layer. In addition, the method includes performing a stacked gate etch on the second polysilicon layer, performing an SAS etch, performing a shallow source implant and forming a spacer between the first polysilicon layer and the second polysilicon layer. A silicide line is subsequently deposited to connect device source regions.

These and other advantages of the present invention will no doubt become obvious to those of ordinary skill in the art after having read the following detailed description of the preferred embodiments which are illustrated in the drawing figures.

BRIEF DESCRIPTION OF THE DRAWINGS

The accompanying drawings, which are incorporated in and form a part of this specification, illustrate embodiments of the invention and, together with the description, serve to explain the principles of the invention.

FIG. 1F shows a perspective view of a stacked gate semiconductor device structure during a phase of a conventional semiconductor fabrication process.

DETAILED DESCRIPTION OF THE INVENTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well known methods, procedures, and components have not been described in detail as not to unnecessarily obscure aspects of the present invention.

FIGS. 2A–2D illustrate the steps performed in a semiconductor device fabrication process that features the utilization of a silicide line to connect semiconductor device source regions together according to one embodiment of the present invention. This feature enables the production of semiconductor device structures that feature narrower junctions and improved short channel characteristics. The utilization of a silicide line, eliminates the need to employ heavy implants (e.g., VCI etc.) to connect the source regions. The smaller dimensions of the shallow source implant that can be employed increases the effective channel length of the constructed device by reducing the channel space occupied by the source implant.

Figure 2A:
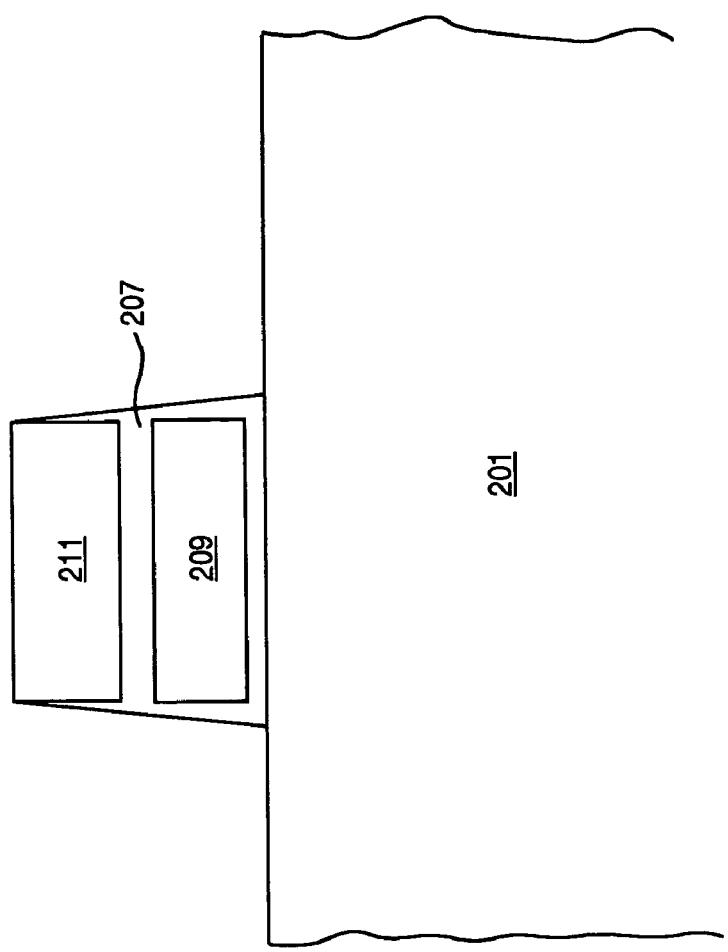
FIG. 2A shows a stacked gate semiconductor device structure according to one embodiment of the present invention.

FIG. 2A shows a stacked gate semiconductor device structure according to one embodiment of the present invention. FIG. 2A shows substrate 201, ONO spacer layer 207, first polysilicon layer 209 and second polysilicon layer 211.

According to one embodiment, the short circuiting together of the first and second polysilicon layers (e.g., 209 and 211 respectively) may be prevented by forming a spacer layer between the two polysilicon layers. According to this embodiment, the spacer layer may be formed by using a deposited ONO spacer layer 207. It should be appreciated that the stacked gate structure shown in FIG. 2A may be arrived at by performing a first polysilicon deposition and etch to form first polysilicon layer 209, an ONO deposition and etch to form ONO spacer layer 207, followed by a subsequent polysilicon deposition and etch to form second polysilicon layer 211.

Figure 2B:
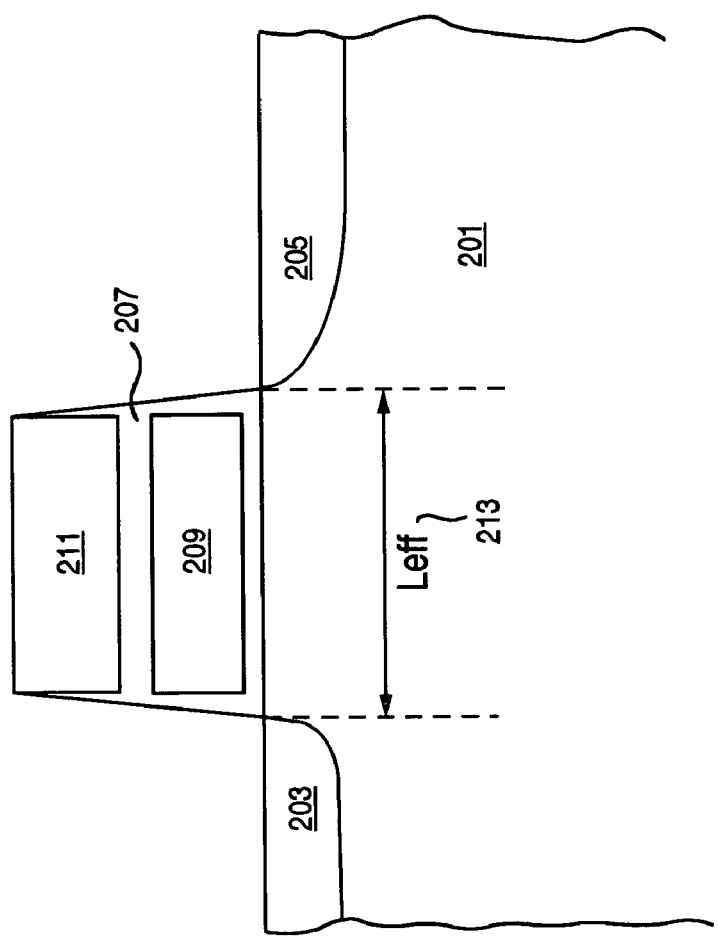
FIG. 2B shows the stacked gate structure of FIG. 2A after the performance of a shallow source implant according to one embodiment of the present invention.

FIG. 2B shows the stacked gate structure after the performance of a shallow source implant according to one embodiment of the present invention. In addition to the structures enumerated above in the discussion of FIG. 2A, FIG. 2B shows source region 203, drain region 205 and effective channel length 213. As previously mentioned, the smaller dimensions of the shallow source implant 203 increases the effective channel length 213 of the constructed device because of the reduced channel space that is occupied by the source implant. It should be appreciated that the smaller source implant reduces the level of lateral diffusion of the source junction into the semiconductor device channel. The reduction in lateral diffusion results in an increase in the effective channel length 213 and a lowered sheet resistance.

Figure 1A:
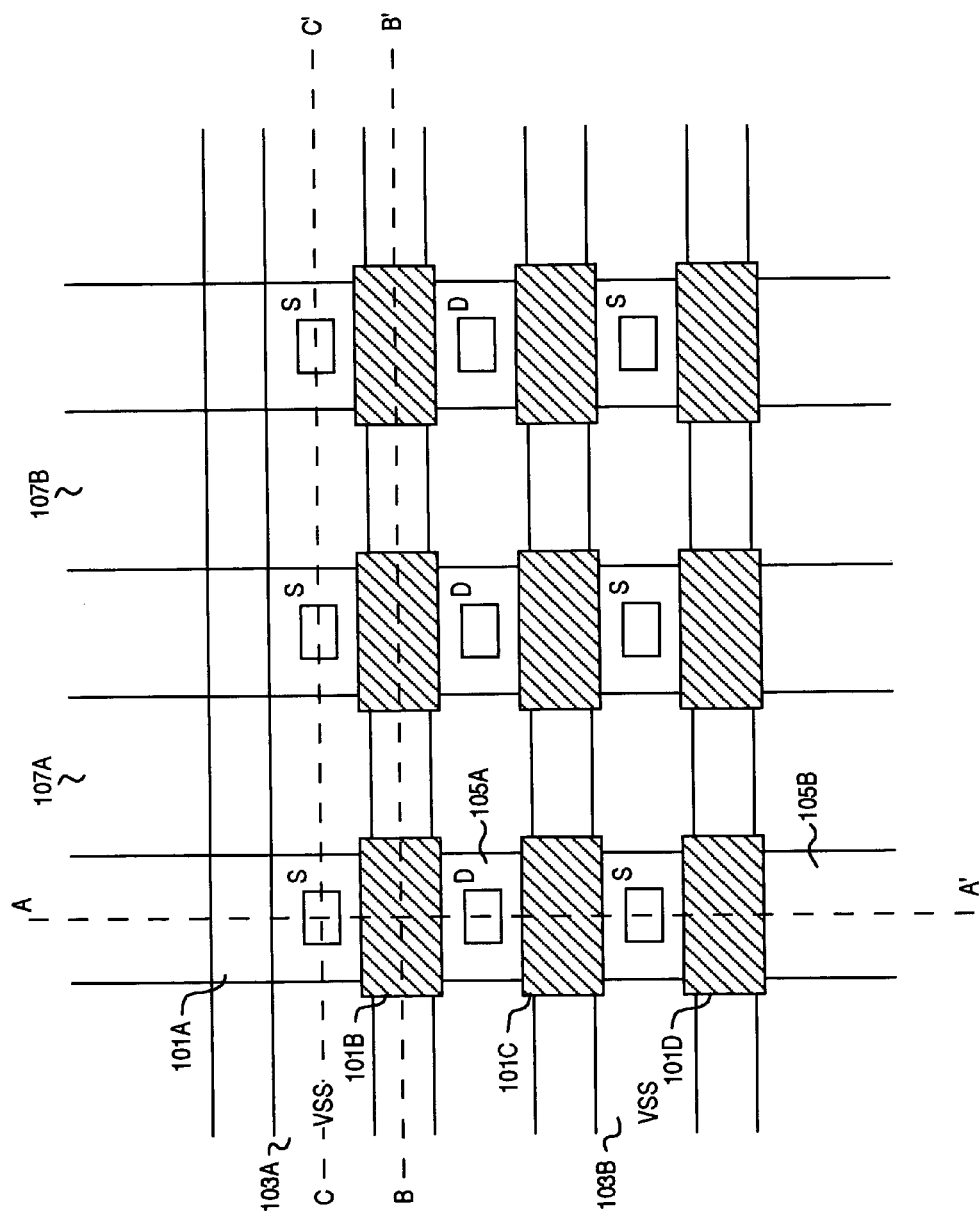
FIG. 1A shows a diagram of a semiconductor wafer that is patterned using a conventional semiconductor fabrication process.
Figure 1B:
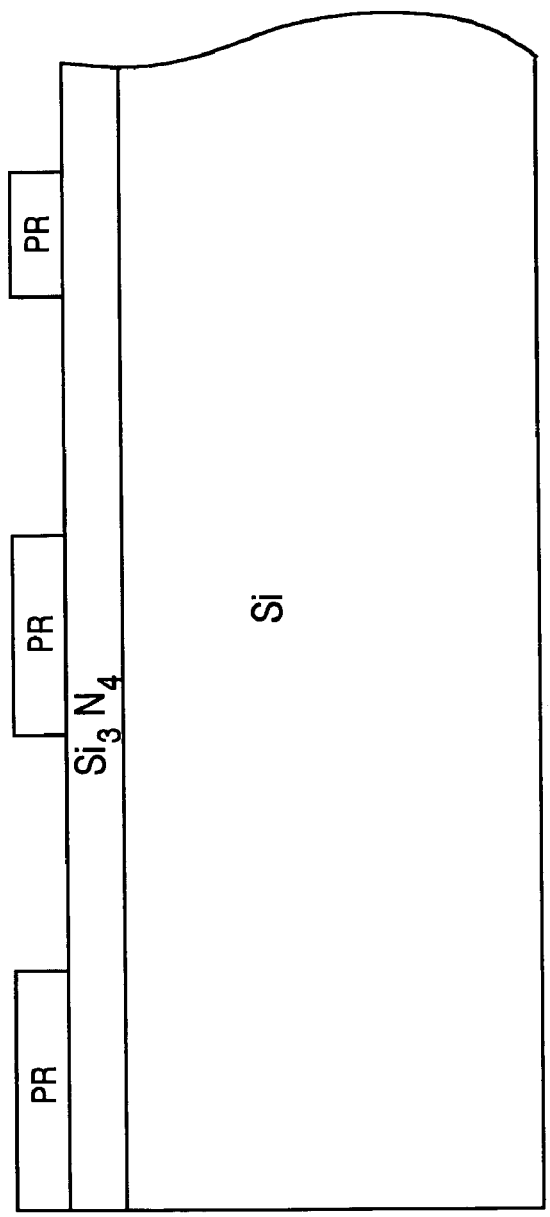
FIG. 1B shows a perspective view of a semiconductor device during a phase of a conventional semiconductor fabrication process.
Figure 1C:
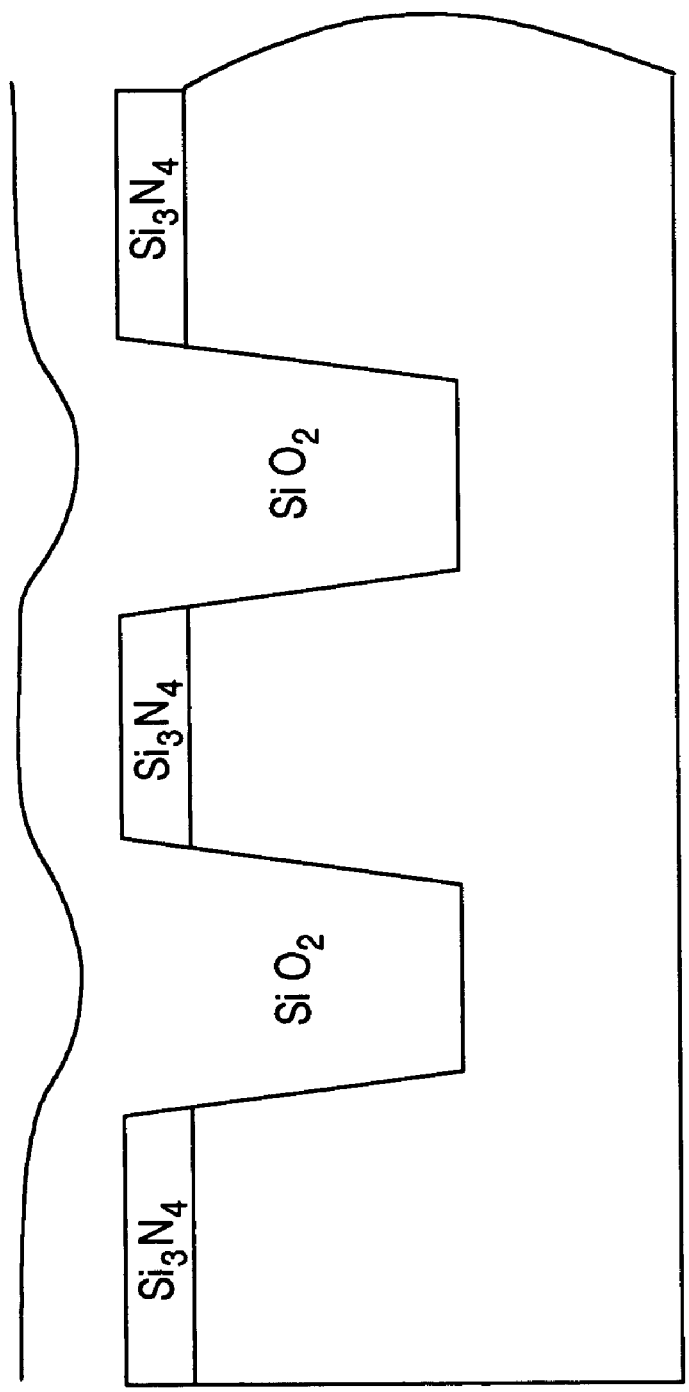
FIG. 1C shows a perspective view of a semiconductor device during a phase of a conventional semiconductor fabrication process.
Figure 1D:
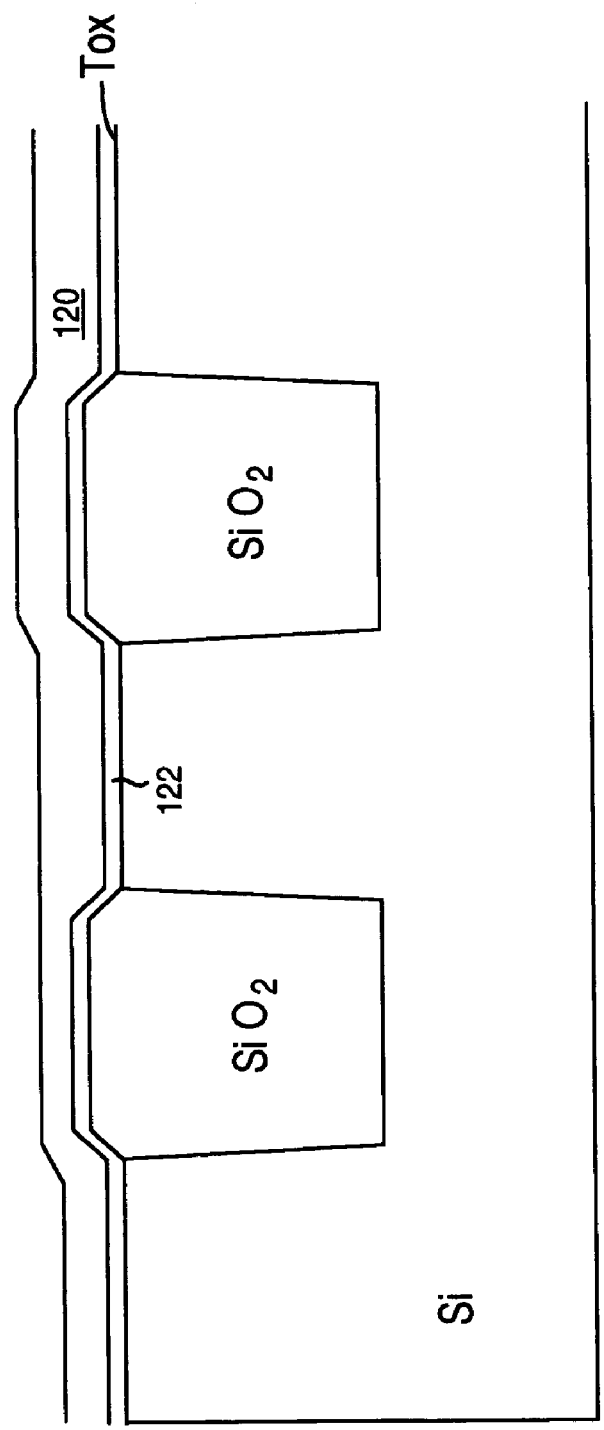
FIG. 1D shows a perspective view of a semiconductor device during a phase of a conventional semiconductor fabrication process.
Figure 1E:
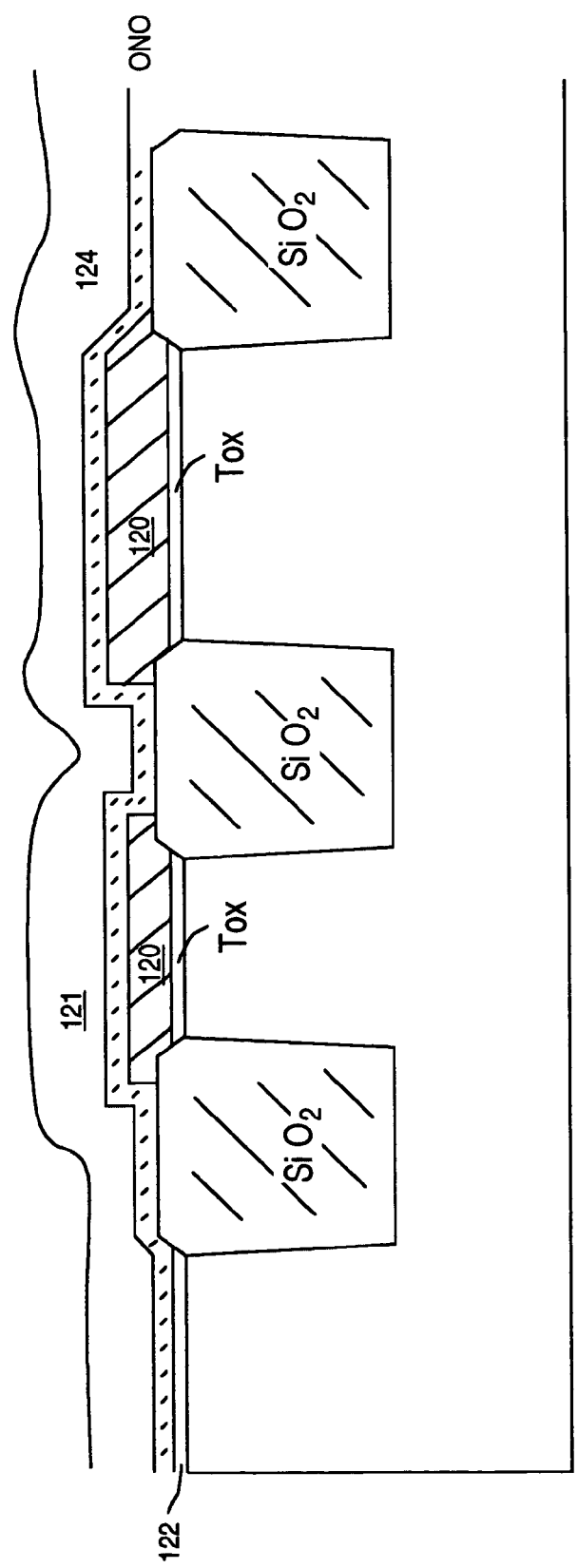
FIG. 1E shows a perspective view of a semiconductor device during a phase of a conventional semiconductor fabrication process.
Figure 3:
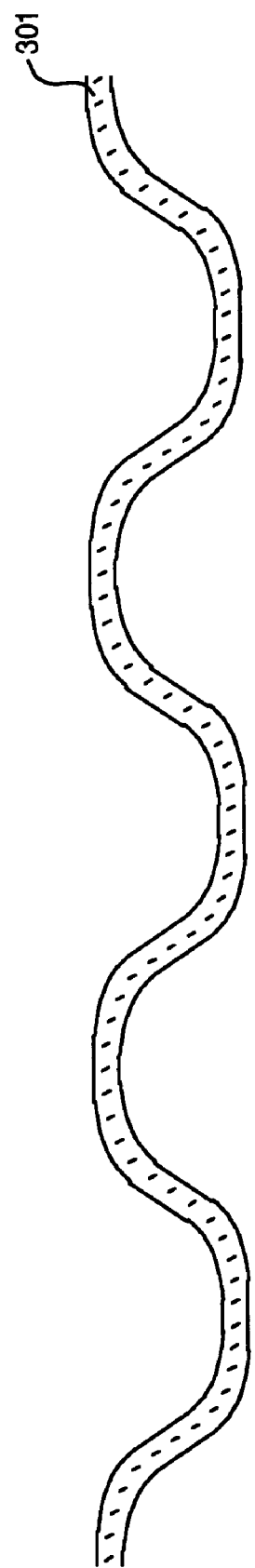
FIG. 3 shows a perspective view of the device shown in FIG. 2B as seen when cut along a line positioned as is line CC" shown in FIG. 1A after the formation of a silicide layer connecting device source regions according to one embodiment of the present invention.

FIG. 3 shows a perspective view of an exemplary semiconductor wafer as seen when cut along a line positioned as is line CC" shown in FIG. 1A after the formation of a silicide layer according to one embodiment of the present invention. According to one embodiment, as is shown in FIG. 3, a layer of CoSi 301 (e.g., VSS line) may be deposited in order to connect together the semiconductor device source regions (e.g., 203). It should be appreciated that, the utilization of a CoSi layer 301 eliminates the need to employ a heavy VCI implant in order to form low resistance conductive lines. As previously mentioned, the shallow source implant 203 reduces lateral diffusion into the junction from the source implant 203. The reduction in lateral diffusion results in an increase in the effective channel length 213 and a lowered sheet resistance.

Figure 4:
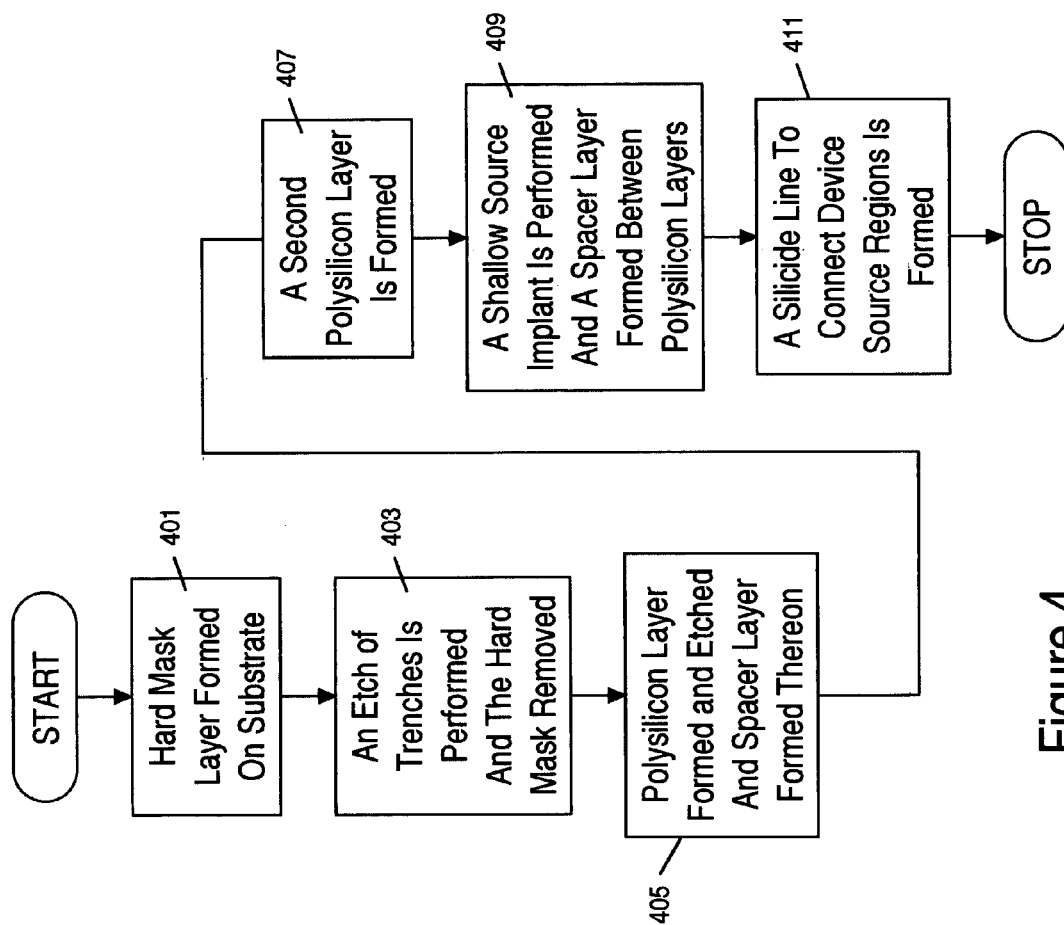
FIG. 4 shows a flowchart of the steps performed in a process for fabricating a semiconductor device having improved short channel effects according to one embodiment of the present invention.

FIG. 4 shows a flowchart of the steps performed in a process for fabricating a semiconductor device having improved short channel effects according to one embodiment of the present invention.

At step 401, a hard mask layer is formed on the surface of a semiconductor substrate and a photoresist mask is printed above the hard mask layer. At step 403, an etch of trenches is performed in the semiconductor substrate and the hard mask layer and the photoresist mask are removed.

At step 405, a first polysilicon layer is formed and etched and a spacer layer deposited thereon. At step 407, a second polysilicon layer is deposited, a stacked gate etch of the second polysilicon layer is performed and an SAS etch is performed.

At step 409, a shallow source implant is performed and a spacer layer is formed between said first polysilicon layer and said second polysilicon layer. And, at step 411 a silicide line to connect the semiconductor device source regions is formed.

Thus, a method for fabricating a semiconductor device having improved short channel effects is disclosed. The method includes operations such as, forming a hard mask layer on the surface of a semiconductor substrate, printing a photoresist mask above the hard mask layer, performing an etch of trenches in the semiconductor substrate and removing the hard mask layer and the photoresist mask. Moreover, the method includes forming a first polysilicon layer 209, etching the first polysilicon layer, depositing an ONO layer 207 and depositing a second polysilicon layer 211. In addition, the method includes performing a stacked gate etch on the second polysilicon layer, performing an SAS etch, performing a shallow source implant 203 and forming a spacer 207 between the first polysilicon layer 209 and the second polysilicon layer 211. A silicide line 301 (e.g., VSS) is subsequently deposited to connect device source regions.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

What is claimed is:

1. A semiconductor device comprising:
   a semiconductor substrate;
   a first polysilicon layer formed above said semiconductor substrate;
   a second polysilicon layer formed above said first polysilicon layer and above said semiconductor substrate;
   a spacer layer situated between said first polysilicon layer and said second polysilicon layer and above said semiconductor substrate;
   source implants formed in said semiconductor substrate wherein said source implants are disposed as shallow implants in said substrate; and
   a silicide line connecting source regions of said semiconductor device.

2. The semiconductor device of claim 1 further comprising a stacked gate arrangement.

3. The semiconductor device of claim 2 wherein the effective channel length of said semiconductor device is increased in relation to a decrease in the lateral diffusion of a source junction.

4. The semiconductor device of claim 3 wherein said spacer prevents shorting of said first polysilicon layer and said second polysilicon layer.

5. The semiconductor device of claim 4 wherein said silicide line comprises CoSi.

6. The semiconductor device of claim 5 wherein the resistance of the silicide line is 100 times less than the resistance of doped silicon.

7. The semiconductor device of claim 6 wherein said spacer layer comprises an ONO layer.

* * * * *